United States Patent
Tian et al.

(10) Patent No.: US 7,498,219 B2
(45) Date of Patent: Mar. 3, 2009

(54) METHODS FOR REDUCING CAPACITOR DIELECTRIC ABSORPTION AND VOLTAGE COEFFICIENT

(75) Inventors: Weidong Tian, Dallas, TX (US); Jozef Mitros, Richardson, TX (US); Victor Ivanov, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1045 days.

(21) Appl. No.: 10/413,733

(22) Filed: Apr. 15, 2003

(65) Prior Publication Data

US 2004/0209423 A1   Oct. 21, 2004

(51) Int. Cl.
*H01L 21/8242* (2006.01)

(52) U.S. Cl. ............... 438/239; 438/210; 438/393; 257/312; 257/532

(58) Field of Classification Search ............ 438/210, 438/239, 393, FOR. 145, FOR. 430, FOR. 220; 257/68, 71, 296, 312, 516, 532
See application file for complete search history.

(56) References Cited

U.S. PATENT DOCUMENTS

| | | | |
|---|---|---|---|
| 4,877,751 A | | 10/1989 | Teng et al. |
| 5,185,689 A | * | 2/1993 | Maniar ................ 361/313 |
| 5,192,703 A | | 3/1993 | Lee et al. |
| 5,583,359 A | * | 12/1996 | Ng et al. ................ 257/306 |
| 5,808,335 A | * | 9/1998 | Sung ..................... 257/306 |
| 5,877,533 A | * | 3/1999 | Arai et al. ............... 257/350 |
| 5,914,851 A | * | 6/1999 | Saenger et al. ........... 361/311 |
| 6,159,819 A | | 12/2000 | Tsai et al. |
| 6,410,960 B1 | * | 6/2002 | Arai et al. ............... 257/347 |
| 6,489,196 B1 | | 12/2002 | Lin et al. |
| 2001/0007777 A1 | * | 7/2001 | Fujii ...................... 438/1 |

\* cited by examiner

*Primary Examiner*—N Drew Richards
*Assistant Examiner*—Joannie A Garcia
(74) *Attorney, Agent, or Firm*—Rose A. Keagy; Wade J. Brady, III; Frederick J. Telecky, Jr.

(57) ABSTRACT

Semiconductor devices and fabrication methods are provided in which a capacitor dielectric is provided with phosphorus or other n-type dopants through implantation of other techniques to reduce the voltage coefficient of capacitance and/or the dielectric absorption of the capacitor.

30 Claims, 7 Drawing Sheets

METHODS FOR REDUCING CAPACITOR DIELECTRIC ABSORPTION AND VOLTAGE COEFFICIENT

FIELD OF INVENTION

The present invention relates generally to semiconductor devices and more particularly to semiconductor manufacturing methods for reducing capacitor dielectric absorption and voltage coefficients.

BACKGROUND OF THE INVENTION

Capacitors are employed in digital and analog devices for a variety of purposes, including sample and hold circuits, data converters, filters, and circuits for storing electrical charge, blocking DC voltage levels, and stabilizing power supplies. Typical capacitors used in semiconductor devices are of various types, such as a metal oxide semiconductor (MOS) type, a polysilicon-insulator-polysilicon (PIP) type, a metal-insulator-metal (MIM) type, etc., wherein the type of capacitor employed typically depends on the application (e.g., analog or digital) and desired response characteristics of the device.

In many analog circuit applications, variations in the capacitance value of the circuit capacitors is undesirable. Such capacitance variation is troublesome, for example, in sample and hold circuits and data converters, wherein the operational performance of the entire circuit depends on stable capacitance values. Capacitance values may vary with device temperature and/or applied voltage, where the capacitance changes are believed to be caused by a variety of physical properties of the circuit capacitors. For instance, PIP capacitors suffer from capacitance variations believed to be caused by the doping characteristics of the polysilicon capacitor electrode plates, and as such, these devices exhibit fairly large changes in the capacitance as a function of applied voltage.

Voltage dependent capacitance variation is sometimes expressed or quantified in terms of a voltage coefficient of capacitance (VCC), typically measured in parts per million per volt (ppm/V) for a first order coefficient $Vcc_1$ and in parts per million per volt$^2$ for a second order coefficient $Vcc_2$. In the design and fabrication of high precision analog circuitry, it is desirable to provide capacitors having small VCC values. MOS type capacitors may also suffer from parasitic effects, particularly where the capacitor is located proximate the substrate. MIM type capacitors may be advantageously fabricated in upper interconnect layers of a semiconductor device wafer to mitigate such parasitic effects. MIM capacitors are further desirable, since the electrode plates are fabricated from conductive metal materials, whereby the polysilicon doping issues associated with PIP capacitors are avoided.

Another impediment to fabrication of high precision analog circuits is dielectric absorption in device capacitors, also known as dielectric relaxation, hysteresis, soakage, etc. Dielectric absorption involves small amounts of excess charge being absorbed or released by a capacitor dielectric material after the capacitor has been charged or discharged. If the voltage across a charged capacitor is brought to zero (e.g., shorted) for a short time, the capacitor will appear to "self recharge" slightly after the discharge circuit is opened. Dielectric absorption is believed to affect all capacitors to differing degrees, wherein the amount of dielectric absorption for a particular capacitor depends primarily on the type of dielectric material used and the amount of dielectric material in the capacitor. Dielectric absorption may be quantified as the percent of charge trapped or stored in a capacitor dielectric (as opposed to the charge stored on the capacitor plates) that cannot be removed quickly. This percentage may be approximated as the ratio of the equilibrium value "self recharge" voltage to the voltage before discharge, and is typically expressed in parts per million (ppm).

Capacitance variations in high precision analog circuits are undesirable, and may lead to unacceptable device performance. Accordingly, there is a need for fabrication methods for creating semiconductor devices having capacitors with low dielectric absorption and VCC values.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to semiconductor devices and methods for fabricating semiconductor devices in which phosphorus or other n-type dopants are provided to capacitor dielectric structures to mitigate voltage dependent capacitance variations and/or dielectric absorption effects in the device capacitors.

According to one aspect of the invention, a semiconductor device is provided, which includes a capacitor having a dielectric structure doped with n-type impurities. The capacitor comprises a first conductive plate structure, for example, a conductive material layer formed over a semiconductor body or a doped portion of the semiconductor body. A dielectric structure is formed proximate the first conductive plate structure, and the dielectric structure is provided with phosphorus or other n-type dopants. The capacitor further comprises a second conductive plate structure proximate the dielectric structure, wherein the first and second conductive plate structures and the dielectric structure form a capacitor. The provision of n-type dopants in the capacitor dielectric may advantageously reduce undesired capacitor behavior, such as dielectric absorption and/or voltage dependent capacitance variations, wherein the n-type dopants may be provided to the capacitor dielectric at any point in the fabrication process.

In other aspects of the invention, methods are provided for fabricating capacitors. A first conductive plate structure is provided, for example, by forming a conductive material layer over a semiconductor body or by providing dopants to a portion of the semiconductor body. A dielectric structure is formed proximate the first conductive plate structure and n-type dopants are provided in at least a portion of the dielectric structure. For example, phosphorus may be implanted into the dielectric structure or a portion thereof. In addition, a second conductive plate structure is formed proximate the dielectric structure. The provision of n-type dopants to the dielectric structure of the capacitor may be performed at any point in the fabrication, including but not limited to immediately after formation of the dielectric structure, after the deposition of the second capacitor plate material, and/or after patterning and etching of the plate structure within the scope of the invention.

The following description and annexed drawings set forth in detail certain illustrative aspects and implementations of the invention. These are indicative of but a few of the various ways in which the principles of the invention may be employed.

DETAILED DESCRIPTION OF THE INVENTION

The present invention will now be described with reference to the attached drawings, wherein like reference numerals are used to refer to like elements throughout. The invention relates to semiconductor devices and methods for making the same, in which n-type dopants are provided in capacitor dielectric structures. The various aspects of the invention are hereinafter illustrated and described in the context of exemplary capacitors fabricated in semiconductor devices. However, the invention is not limited to the illustrated examples. Further, it is noted that the devices and structures illustrated herein are not necessarily drawn to scale.

The inventors have appreciated that capacitor dielectric materials may be passivated using phosphorus or other type dopants to advantageously reduce dielectric absorption and/or voltage related capacitance variations (e.g., VCC). While not wishing to be tied to any particular theory, it is believed that trapped charges within a capacitor dielectric material and within surface states at one or both capacitor dielectric/conductive plate interfaces lead to undesirable high dielectric absorption and VCC values. Further, the inventors believe that passivation of the trapped charge through provision of n-type dopants (e.g., Nitrogen (N), Phosphorus (P), Arsenic (As), Antimony (Sb), etc.) may effectively reduce dielectric absorption and VCC effects.

Dielectric absorption may be quantified as a ratio of charge trapped in the dielectric material of a capacitor to the charge stored on the capacitor plates, and is typically expressed in parts per million (ppm). With respect to VCC, voltage related variance in capacitance is often expressed as a ratio of capacitance at a certain applied voltage (e.g., $C_i$) scaled by the capacitance at 0 V (e.g., $C_0$). In this regard, the capacitance $C_i$ can be modeled as a function of applied voltage V according to the following second order equation (1):

$$C_i(V) = C_0 + A*V + B*V^2, \quad (1)$$

where $C_i(0) = C_0$. This relationship may alternatively be expressed as:

$$C_i(V)/C_0 = K + Vcc_1*V + Vcc_2*V^2, \quad (2)$$

where K is theoretically equal to one, and $Vcc_1$, $Vcc_2$ are given in units of parts per million per volt (e.g., ppm/V) and ppm/$V^2$, respectively. In this regard, $Vcc_1$ is given as $A/C_0$ and $VCC_2$ is $B/C_0$.

Figure 1:
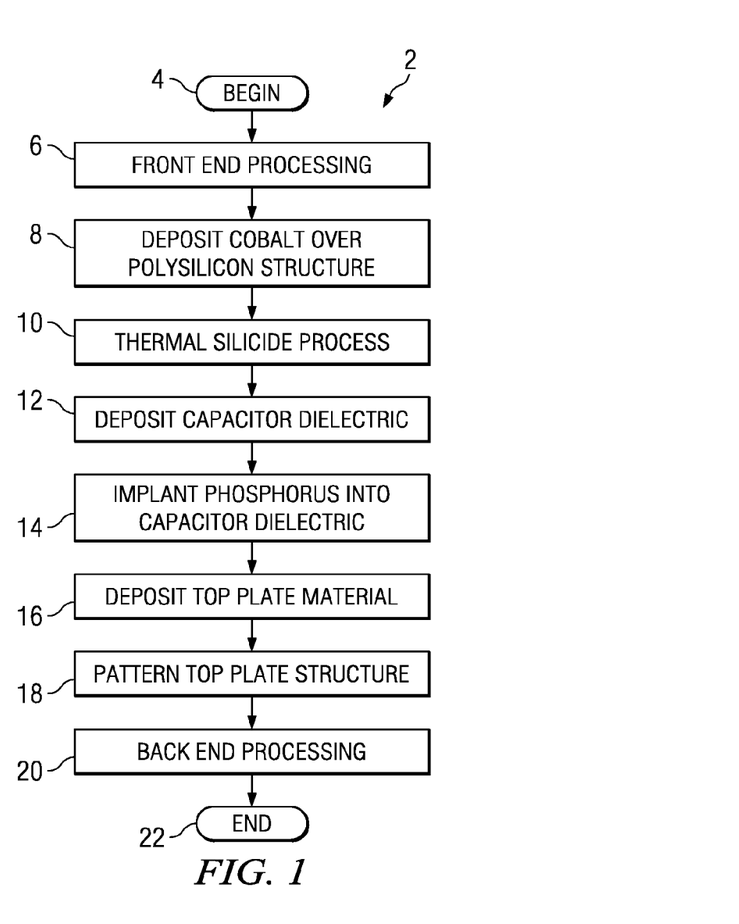
FIG. 1 is a flow diagram illustrating an exemplary method of fabricating capacitors in a semiconductor device in accordance with one or more aspects of the present invention.

Referring initially to FIG. 1, an exemplary method 2 for fabricating semiconductor devices is illustrated and described hereinafter in the context of a vertical capacitor with phosphorus implanted into a dielectric overlying a silicided polysilicon layer. Although the exemplary method 2 and other methods of the invention are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of devices which are illustrated and described herein as well as in association with other devices and structures not illustrated. For example, the exemplary method 2 may be employed in fabricating a capacitor as illustrated and described below with respect to FIGS. 2A-2K.

Beginning at 4, front end processing is performed at 6, including but not limited to formation of isolation structures, transistors, and other electrical structures in and on a semiconductor body. At 8-10, a first capacitor plate structure is fabricated, wherein cobalt is deposited over a polysilicon structure at 8 and a thermal silicide process is performed at 10. Other forms of conductive capacitor plates may be formed or provided in accordance with the present invention, for example, wherein one or both capacitor plates may be formed using polysilicon material (e.g., PIP capacitors) or metal (e.g., MIM capacitors). Furthermore, as discussed below with respect to FIGS. 6 and 7A-7C, the invention may be carried out in association with MOS type capacitors, wherein one of the capacitor plates is a portion of a semiconductor body.

At 12, a dielectric structure is formed proximate the first capacitor plate. In the present example, a dielectric material layer is formed at least partially over the silicide first capacitor plate at 12. Any proximate configuration of capacitor plate and dielectric structures to form an electrical device or circuit which operates as a capacitor is contemplated as falling within the scope of the invention and the appended claims, including but not limited to structures in which one or more materials are physically situated between one or both of the capacitor plate structures and the n-doped capacitor dielectric structure. The dielectric may be formed at 12 using any suitable dielectric material and processing techniques, for example, such as depositing several hundred angstroms (e.g., 500 angstroms) of silicon dioxide (e.g., $SiO_2$) using a chemical vapor deposition (CVD) process employing tetraethyl orthosilicate, $Si(OC_2H_5)_4$ (TEOS) gas.

Phosphorus or other n-type dopants are provided to the capacitor dielectric at 14, through any suitable technique, including but not limited to implantation, diffusion, in-situ doping, etc., in order to passivate trapped charge in the dielectric and/or at one or both of the pate/dielectric interfaces of the resulting capacitor. Where implantation is used at 14, any suitable implantation dose and energy values may be employed, which may be tailored to a given dielectric material type and thickness, as well as to a given implantation species. In one example, phosphorus is implanted into the dielectric using a dose of about $4.0\,E15\,cm^{-2}$ at an energy of about 10 keV in accordance with the invention. In another example, the dielectric is implanted with phosphorus at 14 using a dose of about $1.3\,E16\,cm^{-2}$ at an energy of about 10 keV.

At 16-18, a second capacitor plate structure is formed proximate the dielectric. In the illustrated example, a layer of top plate material is deposited at 16 over the dielectric layer, and the top plate material is then patterned at 18. However, the invention is not limited to vertical capacitor designs. In one implementation, titanium nitride (TiN) is sputter deposited at 16 over the implanted dielectric layer, and suitable lithography and etching techniques are employed at 18 to pattern the TiN material, thereby defining the resulting conductive top capacitor plate structure. Any suitable plate material type, dimensions, and fabrication techniques may be used, wherein the invention is not limited to the illustrated examples. Alternatively, the n-type dopants may be provided to the capacitor dielectric after deposition of the top plate material and/or after patterning of the top plate material within the scope of the invention and the appended claims. Back end processing is performed at 20, including but not limited to interconnect processing, before the method 2 ends at 22.

Figure 2A:
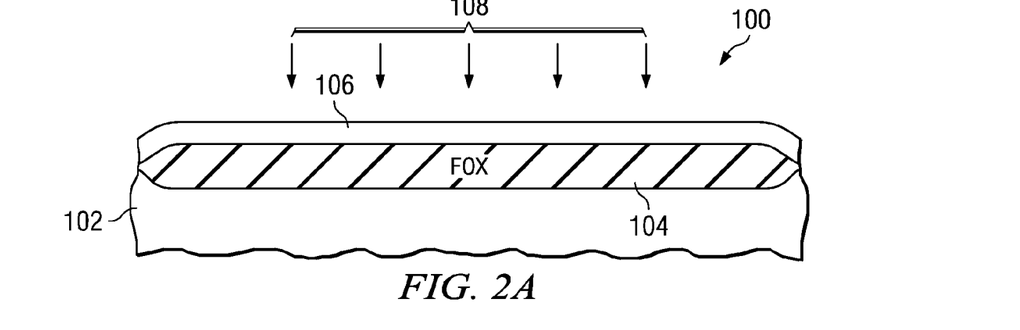
FIGS. 2A-2K are partial side elevation views in section illustrating fabrication of an exemplary capacitor in accordance with the invention.
Figure 2B:
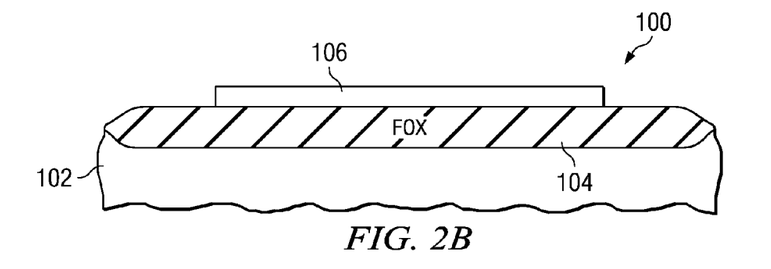

Referring also to FIGS. 2A-2K, fabrication processing of an exemplary semiconductor device 100 is illustrated with respect to formation of a capacitor, wherein the processing may be carried out in accordance with the exemplary method 2 or other methods within the scope of the invention. FIG. 2A illustrates a portion of the device 100 at an intermediate stage of fabrication, wherein a field oxide (e.g., Fox) isolation structure 104 has been formed over a portion of a semiconductor body 102. The invention may be carried out in devices fabricated in or on any type of semiconductor body 102, including but not limited to silicon and SOI wafers. A polysilicon layer 106 is formed over the device 100 via a deposition process 108, which is then patterned to define a polysilicon structure as illustrated in FIG. 2B.

Figure 2C:
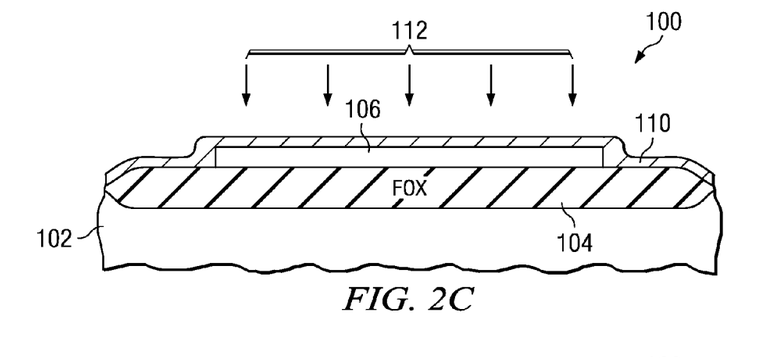
Figure 2D:
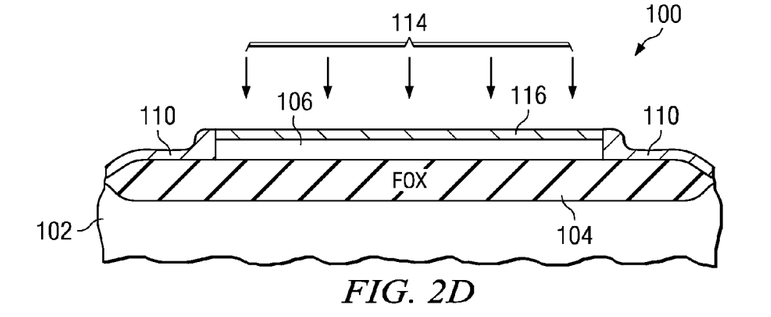
Figure 2E:
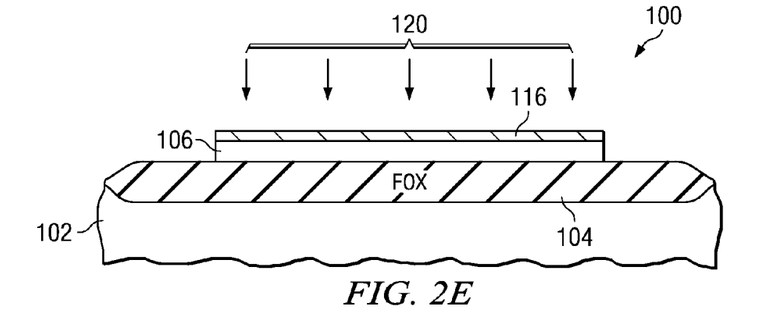
Figure 2F:
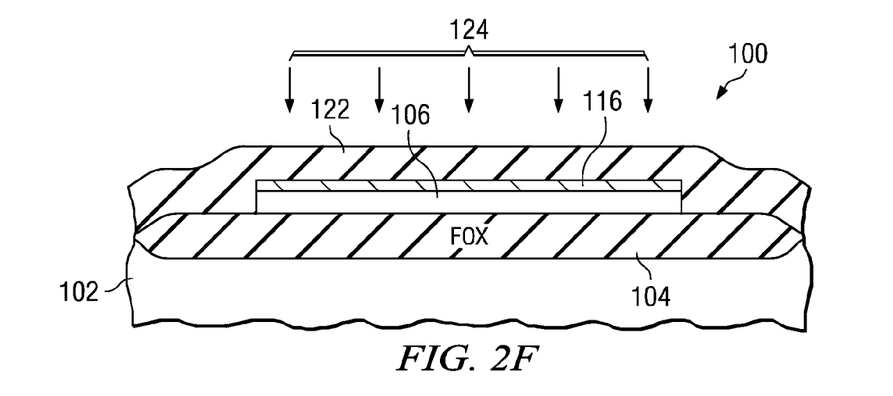

In FIG. 2C, a layer of cobalt (CO) 110 is deposited over the polysilicon 106 via a sputter deposition process 112, wherein the cobalt layer 110 may be formed to any desired thickness using any suitable deposition process 112. In FIG. 2D, a thermal process 114 is employed to react the cobalt 110 and the upper portion of the polysilicon 106 to form a conductive silicide 116, which will operate as a first (e.g., lower) conductive capacitor plate structure. The cobalt deposition process 112 and the thermal silicidation processing 114 in FIGS. 2C and 2D may also be contemporaneously employed to form silicide over transistor gate and source/drain terminals (not shown) in the device 100. Although the illustrated example illustrates a vertical capacitor with a lower silicide plate 116, the invention may be employed in the fabrication of capacitors having capacitor plate structures of any material, shape, and form, wherein the invention is not limited to the illustrated structures or materials. The unreacted cobalt material 110 is stripped and the silicide 116 is annealed via a thermal process 120 in FIG. 2E. In FIG. 2F, a dielectric layer 122 is formed via a deposition process 124, forming a layer of any suitable dielectric material, for example, $SiO_2$.

Figure 2G:
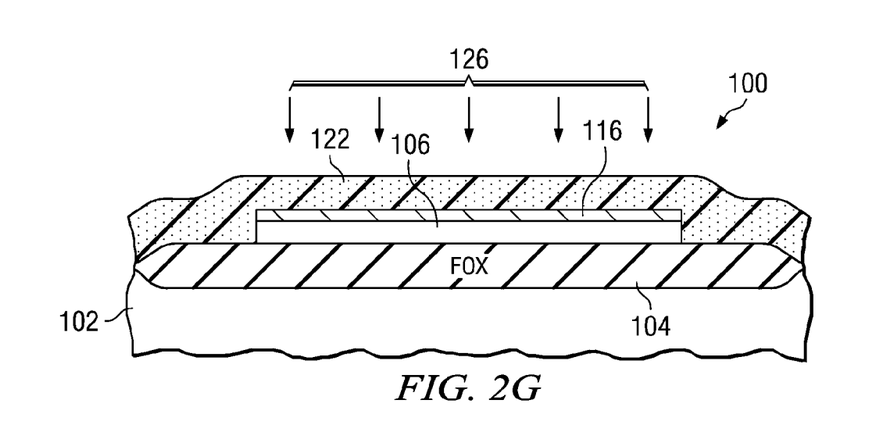

N-type dopants are then provided in all or a portion of the dielectric material 122 in FIG. 2G to passivate trapped charge in the dielectric layer 122 and/or at one or both of the plate/dielectric interfaces of the resulting capacitor. In operation of the finished device 100, this is believed to reduce or mitigate adverse effects of voltage dependent capacitance value variation (e.g., VCC effects) and/or to reduce dielectric absorption, as discussed below with respect to FIGS. 3A-5B. Any n-type dopants or impurities (e.g., N, P, As, Sb, etc.) may be provided to the dielectric 122 within the scope of the invention. Further, the n-type dopants may be provided to any concentration, wherein the n-type dopant concentration in the dielectric 122 may be constant or profiled. Moreover, the n-type dopants may be provided in the dielectric 122 using any suitable technique, including but not limited to implantation and/or diffusion. In the illustrated example, phosphorus is implanted into the dielectric 122 via an implantation process 126 in FIG. 2G. In one implementation, the process 126 employs a dose of about $4.0\,E15\,cm^{-2}$ at an energy of about 10 keV. In another example, the process 126 implants phosphorus into the dielectric 122 using a dose of about $1.3\,E16\,cm^{-2}$ at an energy of about 10 keV. Any suitable implantation process 126 may be used, wherein the invention is not limited to the dose and energy examples set forth herein.

Figure 2H:
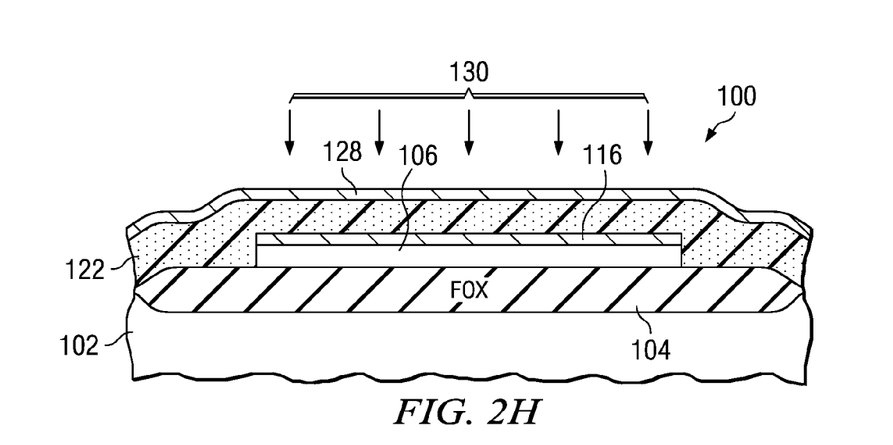
Figure 2I:
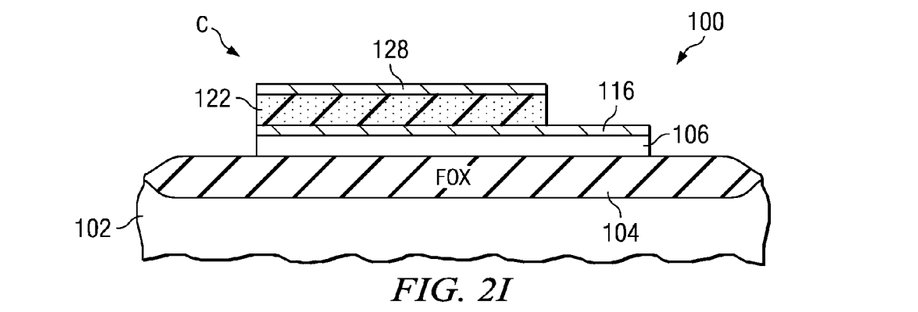
Figure 2J:
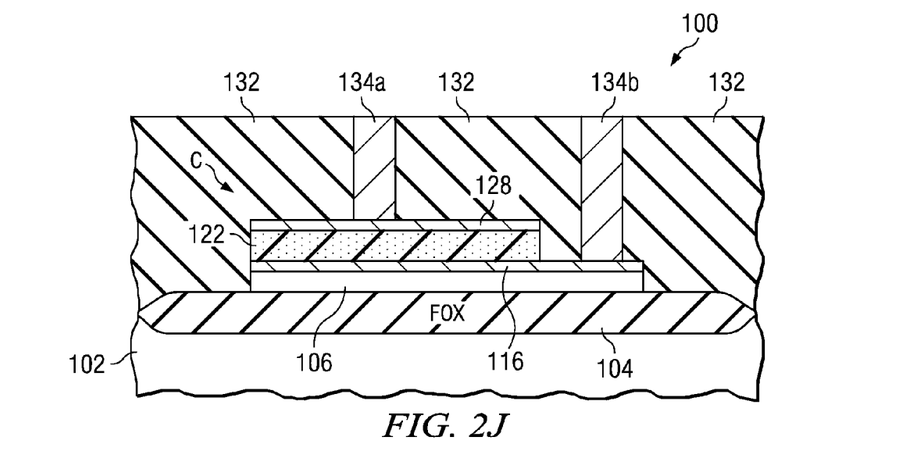
Figure 2K:
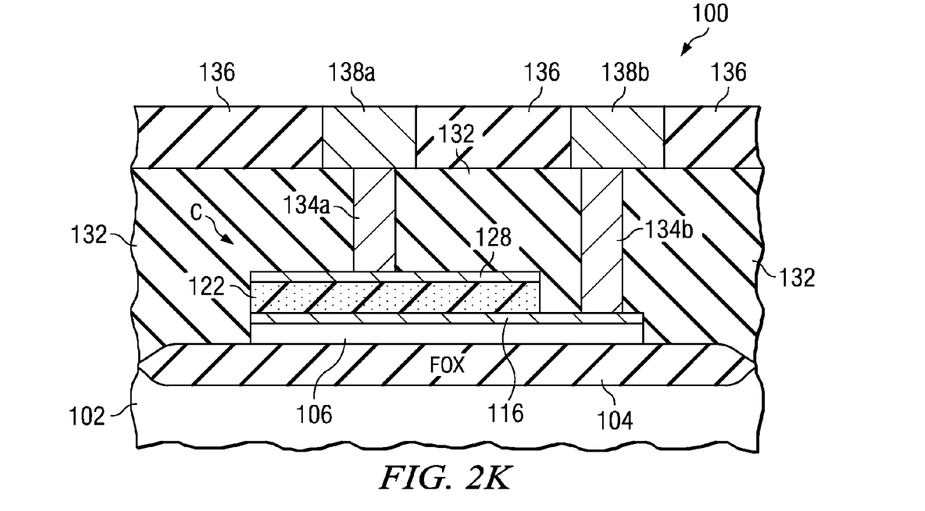

In FIG. 2H, TiN or other conductive material 128 is deposited over the doped dielectric 122 via a deposition process 130, for example, sputtering. In FIG. 2I, the TiN layer 128 and the dielectric 122 are patterned to define the second (e.g., upper) capacitor plate or electrode structure 128. In the exemplary device 100, the resulting upper and lower conductive plate structures 128 and 116, respectively, along with the intervening dielectric structure 122 form a vertical capacitor C. Alternatively, n-type dopants, such as phosphorus, may be implanted into or otherwise provided in the capacitor dielectric 122 after deposition and/or patterning of the upper capacitor plate material 128 within the scope of the invention. As shown in FIGS. 2J and 2K, interconnect processing may then be performed, in which an interlayer or interlevel dielectric (e.g., ILD) material 132 is deposited and conductive contacts 134a and 134b (e.g., tungsten (W), etc.) are formed through the dielectric 132 to electrically connect with the upper and lower capacitor plate structures 128 and 116, respectively (FIG. 2J). Thereafter, one or more interconnect layers or levels may be formed for interconnecting the capacitor C and other electrical components in the device 100, including an overlying dielectric layer 136 with conductive (e.g., copper or other metal) routing structures 138a and 138b connecting to the tungsten contacts 134a and 134b, respectively.

Figure 3A:
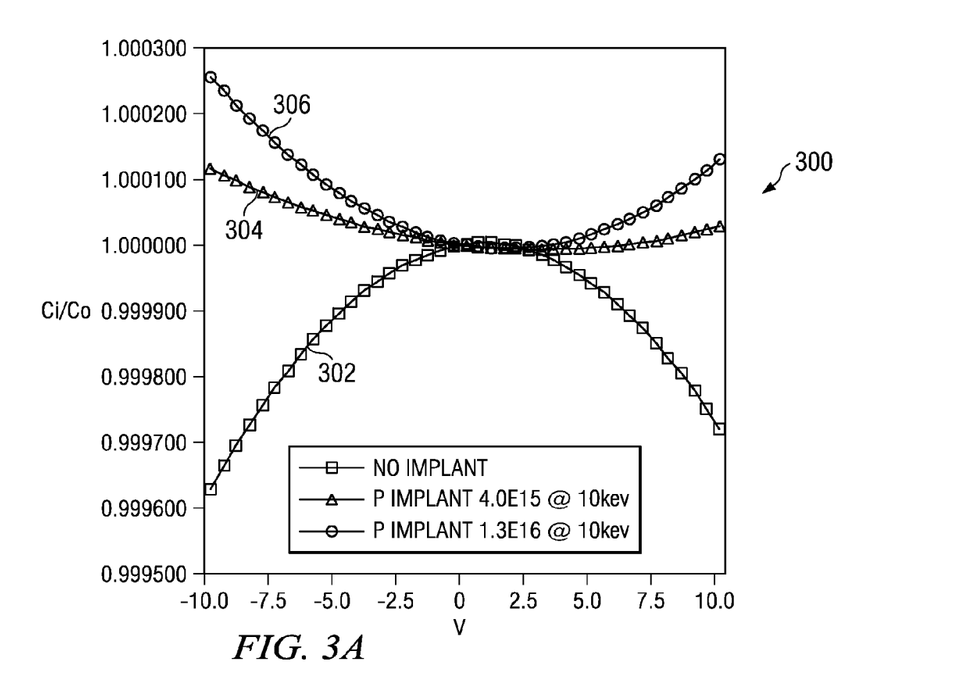
FIG. 3A is a plot illustrating capacitance variations as a function of applied voltage for capacitors with various levels of dielectric implantation according to the invention as well as for a capacitor with no dielectric implantation.
Figure 3B:
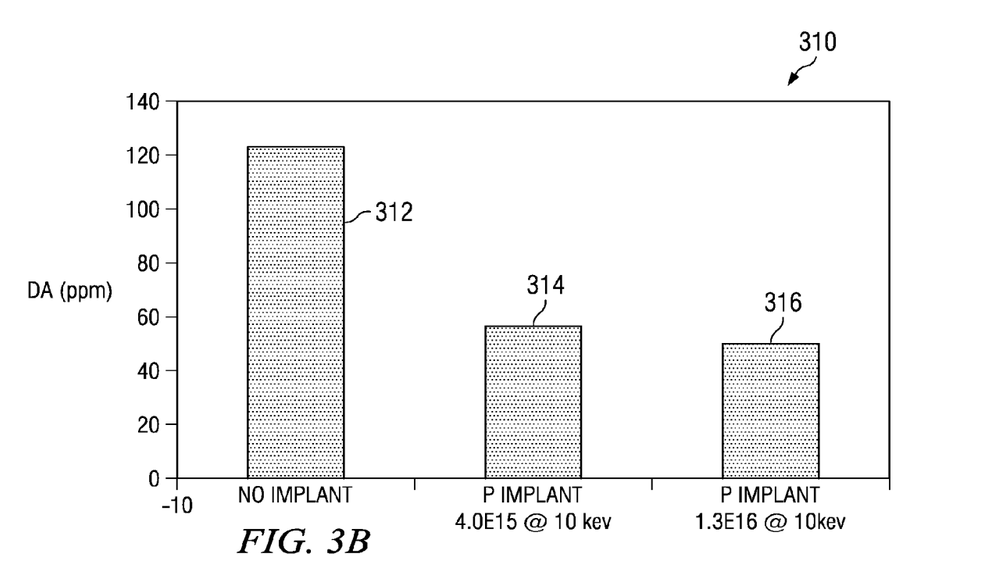
FIG. 3B is a plot illustrating capacitor dielectric absorption for capacitors with various levels of dielectric implantation according to the invention as well as for a capacitor with no dielectric implantation.

Referring now to FIGS. 3A and 3B, several examples are hereinafter described to illustrate performance improvements which may be achieved using the present invention. These performance results are merely examples, and the invention is not limited to implementations which achieve these or any performance improvements. FIG. 3A illustrates a plot 300 showing capacitance value variation as a function of applied voltage, and FIG. 3B provides a plot 310 of dielectric absorption (DA), expressed in ppm for three capacitors. A first curve 302 in the VCC plot 300 corresponds to a capacitor having a dielectric structure with no n-type dopants (e.g., no phosphorus implant). In this example, the coefficients $Vcc_1$ and $Vcc_2$ (equation (1) above) are 4.61575 and −3.2446, respectively, yielding the capacitance variation of the curve 302. With respect to dielectric absorption, a value of 123 ppm was determined for the example of no n-type dopants, indicated as value 312 in FIG. 3B.

In one implementation of the invention, the capacitor dielectric was implanted with phosphorus using a dose of $4.0\,E15\,cm^{-2}$ at an energy of about 10 keV. With respect to VCC performance, this implementation yielded a $Vcc_1$ value of −4.39675 and $Vcc_2$ of 0.73735, as shown in the curve 304 in FIG. 3A. Comparing the curves 302 and 304 in FIG. 3A, the phosphorus implant significantly reduced the voltage related capacitance value variation. In addition, this implementation yielded a significantly reduced dielectric absorption value of 57 (e.g., value 314 in FIG. 3B). In another exemplary implementation, phosphorus was implanted in the capacitor dielectric using a dose of $1.3\,E16\,cm^{-2}$ at an energy of about 10 keV, yielding $Vcc_1=-6.22125$ and $Vcc_2=1.94585$, illustrated in curve 306 of FIG. 3A, with a dielectric absorption value of 50, shown as value 316 in FIG. 3B. It is seen for both examples of phosphorus implantation that improvements (e.g., reductions) in both dielectric absorption (FIG. 3B) and VCC (FIG. 3A) are possible using the various aspects of the present invention, wherein specific implementations can be tailored to achieve other improved performance results.

Figure 4A:
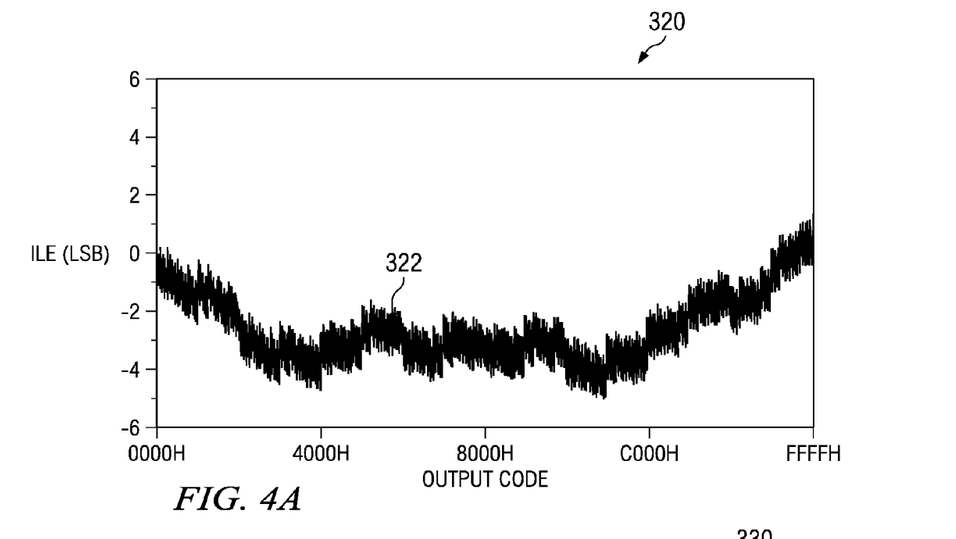
FIGS. 4A and 4B are plots illustrating integral linearity performance for 16 bit analog to digital converters having high VCC capacitors and low VCC capacitors, respectively.
Figure 4B:
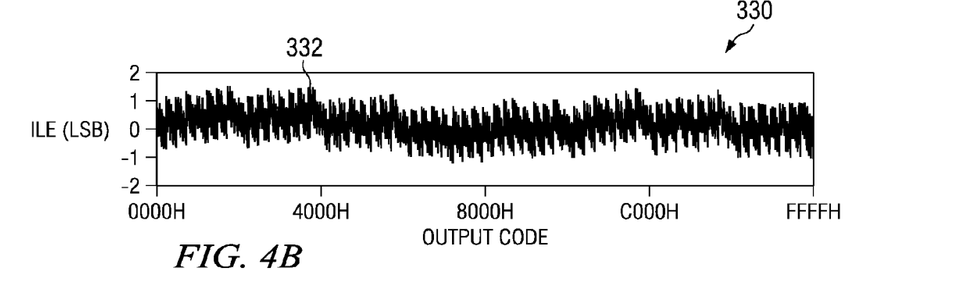

With regard to analog circuit performance, FIGS. 4A and 4B provide plots 320 and 330 illustrating integral linearity error (ILE) performance (also known as integral non-linearity (INL)) for 16 bit analog to digital (A/D) converters having high VCC and low VCC capacitors, respectively. In FIG. 4A, a curve 322 shows integral conversion linearity variance of over 5 least significant bits (LSBs) using high VCC converter capacitors. As seen in the linearity curve 332 of FIG. 4B, however, the use of low VCC capacitors reduces the variance to within about +/−1 LSB. The employment of n-doped capacitor dielectric structures in accordance with the present invention is believed to facilitate the improvements shown in the curve 332 of FIG. 4B by reducing the capacitor VCC coefficients.

Figure 5A:
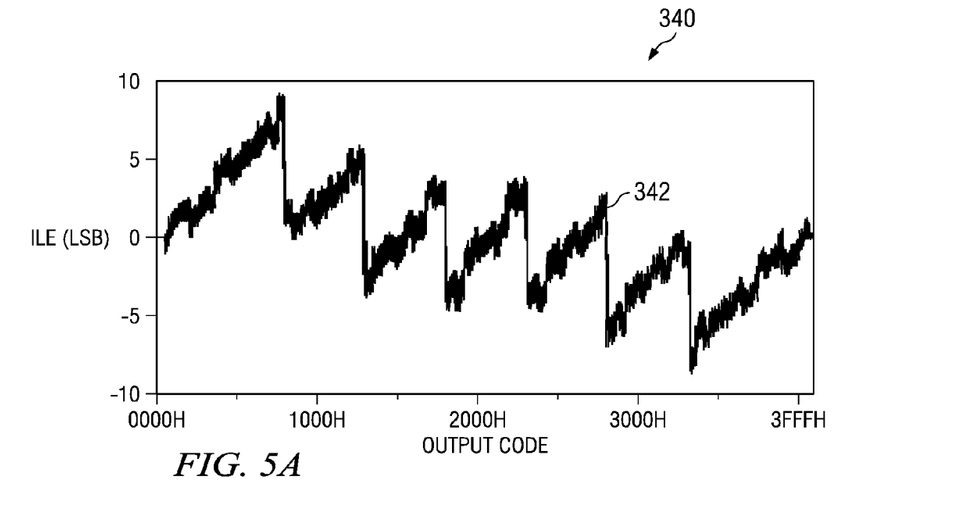
FIGS. 5A and 5B are plots illustrating integral linearity performance for 14 bit analog to digital converters having high dielectric absorption capacitors and low dielectric absorption capacitors, respectively.
Figure 5B:
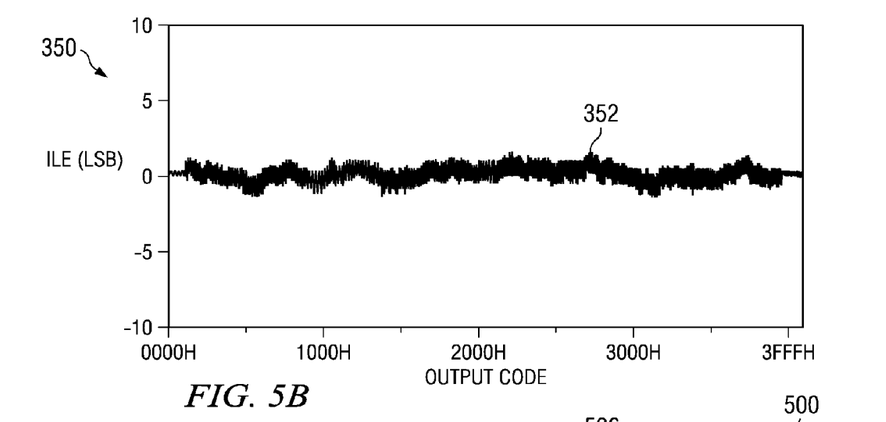

Additional A/D converter linearity comparisons are provided in FIGS. 5A and 5B, which include plots 340 and 350 of integral linearity performance for 14 bit analog to digital converters having high dielectric absorption and low dielectric absorption capacitors, respectively. Curve 342 in FIG. 5A illustrates ILE variance between about +8 and −8 LSBs where capacitors with high dielectric absorption values are used, whereas curve 352 in FIG. 5B shows significant device linearity performance improvement (e.g., less than about 2 LSB variance) where the device employs low dielectric absorption capacitors, wherein reducing the dielectric absorption may be achieved by providing the capacitor dielectric structures with n-type dopants as shown in FIG. 3B above. Accordingly, the inventors believe that significant analog circuit performance improvements are possible through doping the capacitor dielectric structures with n-type dopants such as phosphorus in accordance with the present invention, wherein these results are believed to be related to reduction in dielectric absorption and/or reduction in VCC effects.

Figure 6:
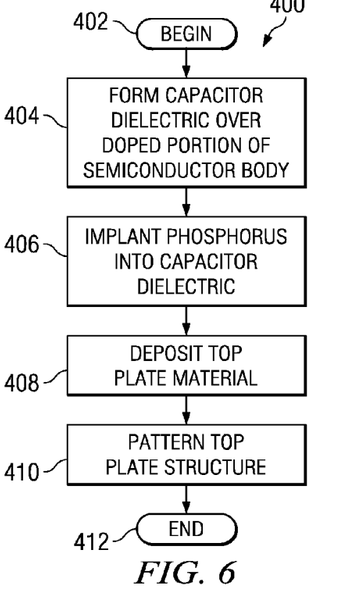
FIG. 6 is a flow diagram illustrating another method of fabricating a capacitor in a semiconductor device in accordance with the invention.

Referring now to FIG. 6, another exemplary method 400 is illustrated for fabricating semiconductor devices, which is particularly applicable to fabrication of MOS type capacitors with n-doped dielectric structures in accordance with the invention. Beginning at 402, a capacitor dielectric material is formed over a doped portion of a semiconductor body. In one implementation, a gate dielectric material is thermally grown and/or deposited over a silicon or SOI wafer surface at 404, which may be concurrent with formation of transistor gate dielectric layers for transistors in the semiconductor device. Phosphorus or other n-type dopants are implanted or otherwise provided to the capacitor dielectric at 406 for passivating trapped charge in the resulting capacitor component. A top plate material is then deposited or otherwise formed over the capacitor dielectric at 408, and the top plate structure is patterned at 410, whereafter the method 400 ends at 412. The n-type dopants may alternatively be provided to the capacitor dielectric at other points in the fabrication process, for example, including but not limited to implantation after the formation and/or patterning of the top plate structure within the scope of the invention and the appended claims.

Figure 7A:
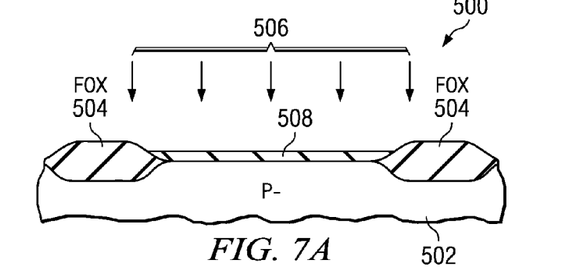
FIGS. 7A-7C are partial side elevation views in section illustrating fabrication of another exemplary capacitor in accordance with the invention.
Figure 7B:
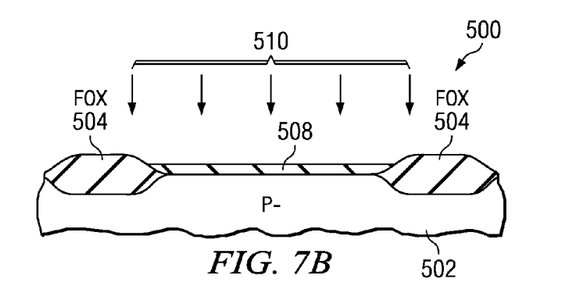
Figure 7C:
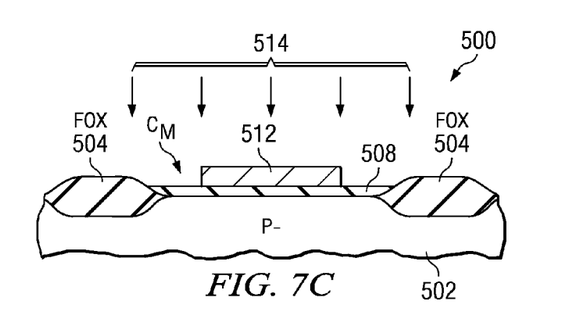

FIGS. 7A-7C illustrate a portion of another exemplary semiconductor device 500 undergoing capacitor fabrication processing in accordance with the invention. A MOS type capacitor is formed in the device 500 generally in accordance with the exemplary method 400 of FIG. 6, which may alternatively be formed according to other methods of the invention. In FIG. 7A, the device 500 is shown at an intermediate stage of fabrication, wherein field oxide isolation structures 504 have been formed in isolation regions of a p-doped semiconductor body 502, such as a silicon or SOI wafer. Alternatively, the body 502 may comprise a doped well region within the substrate. An oxidation process 506 is performed to form a gate oxide dielectric layer 508 over a doped portion of the semiconductor body 502 in FIG. 5A. The exemplary process 506 involves thermal processing of the device wafer in an oxidizing environment to form $SiO_2$ over the semiconductor body 502. The dielectric 508 can be thus formed to any desired thickness. Alternatively, the dielectric 508 can be formed of other dielectric materials using thermal oxidation and/or deposition processes, wherein the dielectric 508 may be formed using a multi-step process flow or in a single processing step.

In FIG. 7B, an implantation process 510 is performed to implant n-type dopants, such as phosphorus, into all or a portion of the dielectric layer 508 to passivate trapped charge in the dielectric layer 122 and/or at the resulting capacitor plate/dielectric interfaces, which is believed to reduce or mitigate adverse VCC and/or dielectric absorption effects. As with the above examples, any suitable n-type dopants or impurities (e.g., N, P, As, Sb, etc.) may be provided to the dielectric 508 to any concentration within the scope of the invention, wherein the dopant concentration in the dielectric 508 may be constant or profiled. Moreover, the n-type dopants may be provided in the dielectric 122 using other suitable processes or combinations thereof, for example, such as diffusion. The exemplary process 510 implants phosphorus into the dielectric 508 using a dose of about $4.0\,E15\,cm^{-2}$ at an energy of about 10 keV. In another example, the process 510 implants phosphorus into the dielectric 508 using a dose of about $1.3\,E16\,cm^{-2}$ at an energy of about 10 keV, although the invention is not limited to the dose and energy examples set forth herein. In FIG. 7C, a conductive upper or top plate material 512 is formed, such as through deposition and patterning processing 514. Alternatively, the n-type dopants may be provided in the capacitor dielectric 122 after formation and/or patterning of the plate material 512 in accordance with the invention. A MOS type capacitor structure $C_M$ is thus formed including the upper conductive plate structure 512 and the n-doped capacitor dielectric structure 508, wherein the underlying portion of the semiconductor body 502 operates as the lower capacitor plate in the device 500.

The above techniques may facilitate improved capacitor performance, particularly in analog circuit applications via a short, low cost implant to supply phosphorus or other n-type dopants to passivate trapped charge and to thereby reduce undesired VCC and/or dielectric absorption effects. The invention may be carried out in the integration of capacitor device formation at any point in a fabrication process, and is not limited to the examples illustrated and described herein.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a capacitor in a semiconductor device, comprising:
   providing a first conductive plate structure;
   forming a dielectric structure proximate the first conductive plate structure;
   providing n-type dopants to at least a portion of the dielectric structure; and
   forming a second conductive plate structure proximate the dielectric structure.

2. The method of claim 1, wherein the dielectric structure is formed over at least a portion of the first conductive plate structure.

3. The method of claim 2, wherein the second conductive plate structure is formed over at least a portion of the dielectric structure.

4. The method of claim 1, wherein the second conductive plate structure is formed over at least a portion of the dielectric structure.

5. The method of claim 1, wherein providing n-type dopants comprises implanting n-type dopants into at least a portion of the dielectric structure.

6. The method of claim 5, wherein providing n-type dopants comprises implanting phosphorus into at least a portion of the dielectric structure.

7. The method of claim 6, wherein the dielectric structure is implanted using a dose of about 4 E15 $cm^{-2}$ an energy of about 10 keV.

8. The method of claim 6, wherein the dielectric structure is implanted using a dose of about 1.3 E16 $cm^{-2}$ an energy of about 10 keV.

9. The method of claim 6, wherein the dielectric structure is formed over at least a portion of the first conductive plate structure.

10. The method of claim 9, wherein the second conductive plate structure is formed over at least a portion of the dielectric structure.

11. The method of claim 1, wherein providing n-type dopants comprises providing phosphorus in at least a portion of the dielectric structure.

12. A method of fabricating a capacitor in a semiconductor device, comprising:
    providing a semiconductor body, at least a portion of the semiconductor body comprising dopants;
    forming a dielectric structure proximate the at least a portion of the semiconductor body comprising dopants;
    providing n-type dopants to at least a portion of the dielectric structure; and
    forming a conductive plate structure proximate the dielectric structure.

13. The method of claim 12, wherein forming the conductive plate structure comprises polysilicon.

14. The method of claim 12, wherein providing n-type dopants comprises implanting n-type dopants into at least a portion of the dielectric structure.

15. The method of claim 14, wherein providing n-type dopants comprises implanting phosphorus into at least a portion of the dielectric structure.

16. The method of claim 15, wherein the dielectric structure is implanted using a dose of about 4 E15 $cm^{-2}$ at an energy of about 10 keV.

17. The method of claim 15, wherein the dielectric structure is implanted using a dose of about 1.3 E16 $cm^{-2}$ at an energy of about 10 keV.

18. The method of claim 12, wherein providing n-type dopants comprises providing phosphorus in at least a portion of the dielectric structure.

19. A method for fabricating a semiconductor device, comprising:
    forming a capacitor having first and second conductive plates and a dielectric proximate the first and second plates; and
    providing n-type dopants to at least a portion of the dielectric.

20. The method of claim 19, wherein providing the n-type dopants comprises providing phosphorus to the portion of the dielectric.

21. The method of claim 19, wherein providing n-type dopants comprises implanting n-type dopants into the portion of the dielectric.

22. The method of claim 21, wherein implanting n-type dopants comprises implanting phosphorus into the portion of the dielectric.

23. A semiconductor device, comprising:
    a capacitor, the capacitor comprising:
      a first conductive plate structure;
      a dielectric structure proximate the first conductive plate structure, the dielectric structure comprising n-type dopants; and
      a second conductive plate structure proximate the dielectric structure.

24. The device of claim 23, wherein the first conductive plate structure is a doped portion of a semiconductor body.

25. The device of claim 24, wherein the dielectric structure comprises phosphorus.

26. The device of claim 23, wherein the dielectric structure comprises phosphorus.

27. The device of claim 26, wherein the dielectric structure is located over at least a portion of the first conductive plate structure.

28. The device of claim 27, wherein the second conductive plate structure is located over at least a portion of the dielectric structure.

29. The device of claim 23, wherein the dielectric structure is located over at least a portion of the first conductive plate structure.

30. The device of claim 23, wherein the second conductive plate structure is located over at least a portion of the dielectric structure.

* * * * *